(12) United States Patent
Baek et al.

(10) Patent No.: US 7,705,449 B2
(45) Date of Patent: Apr. 27, 2010

(54) COOLING APPARATUS FOR MEMORY MODULE

(75) Inventors: Joong Hyun Baek, Suwon-si (KR);
Yong Hyun Kim, Suwon-si (KR);
Kwang Ho Chun, Asan-si (KR); Chang Yong Park, Cheonan-si (KR); Hae Hyung Lee, Suwon-si (KR); Hee Jin Lee, Seongnam-si (KR)

(73) Assignee: Samsung Electronics Co., Ltd., Suwon-Si (KR)

( * ) Notice: Subject to any disclaimer, the term of this patent is extended or adjusted under 35 U.S.C. 154(b) by 764 days.

(21) Appl. No.: 11/528,211

(22) Filed: Sep. 27, 2006

(65) Prior Publication Data
US 2007/0170580 A1 Jul. 26, 2007

(30) Foreign Application Priority Data
Jan. 25, 2006 (KR) .................... 10-2006-0007575

(51) Int. Cl.
*H01L 23/34* (2006.01)
(52) U.S. Cl. .................. 257/723; 257/706; 257/707; 257/717; 257/720; 257/E31.131; 257/E23.101; 257/E23.105
(58) Field of Classification Search .............. 257/723, 257/276, 625, 675, 706, 707, 712–722, 796, 257/E33.075, E31.131, E23.051, E23.08–E23.113
See application file for complete search history.

(56) References Cited

U.S. PATENT DOCUMENTS 6,605,868 B2 * 8/2003 Ishiwata et al. ............. 257/703

* cited by examiner

*Primary Examiner*—Jasmine J Clark
(74) *Attorney, Agent, or Firm*—F. Chau & Associates, LLC (57) ABSTRACT

A cooling apparatus for a circuit module having a substrate extending axially with an IC chip of a first type and IC chips of a second type mounted thereon, comprising: a first heat spreading element disposed to form a heat conduction path with the IC chip of the first type; and a second heat spreading element disposed to form a heat conduction path with the IC chips of the second type, wherein there is at least one IC chip of the second type mounted axially away from opposite sides of the IC chip of the first type, wherein the first type of IC chip is capable of generating a larger amount of heat than the second type of IC chips, and the first heat spreading element has a higher thermal conductivity than the second heat spreading element.

42 Claims, 9 Drawing Sheets

COOLING APPARATUS FOR MEMORY MODULE

CROSS-REFERENCE TO RELATED PATENT-APPLICATION

This application claims the priority under 35 USC §119 of Korean Patent Application No. 2006-0007575, filed on Jan. 25, 2006, the disclosure of which is incorporated by reference herein.

BACKGROUND OF THE INVENTION

1. Technical Field

The present invention relates to a cooling apparatus for memory modules, more particularly, to a cooling apparatus for a Fully Buffered Dual In-lined Memory Module (FB-DIMM).

2. Discussion of Related Art

A memory module having a plurality of chips mounted on a printed circuit board (PCB) may be classified as a single in-line memory module (SIMM) or a dual in-line memory module (DIMM). A SIMM is a memory module having memory chips mounted on a single side of a PCB and a DIMM is a memory module having memory chips mounted on both sides of the PCB. FBDIMMs are DIMMs which operate in accordance with a packet protocol, which usually operate at higher-speed and at higher capacity than non FBDIMMs.

The FBDIMM includes a plurality of memory chips and an advanced memory buffer (AMB) which handles received packets at high data rate and converts the packets into memory commands. The AMB interfaces with memory chips mounted on the DIMM and transfers data to and from the plurality of memory chips. Due to the high speed operation and large volume of data transfer, a large amount of heat is generated. The AMB is usually the chip that generates the most heat and thus operates at a higher temperature among all chips onboard the FBDIMM. It is not unusual to find the heat generated by the AMB being an order of magnitude higher than that of the memory circuit chips of the FBDIMM.

Figure 10:
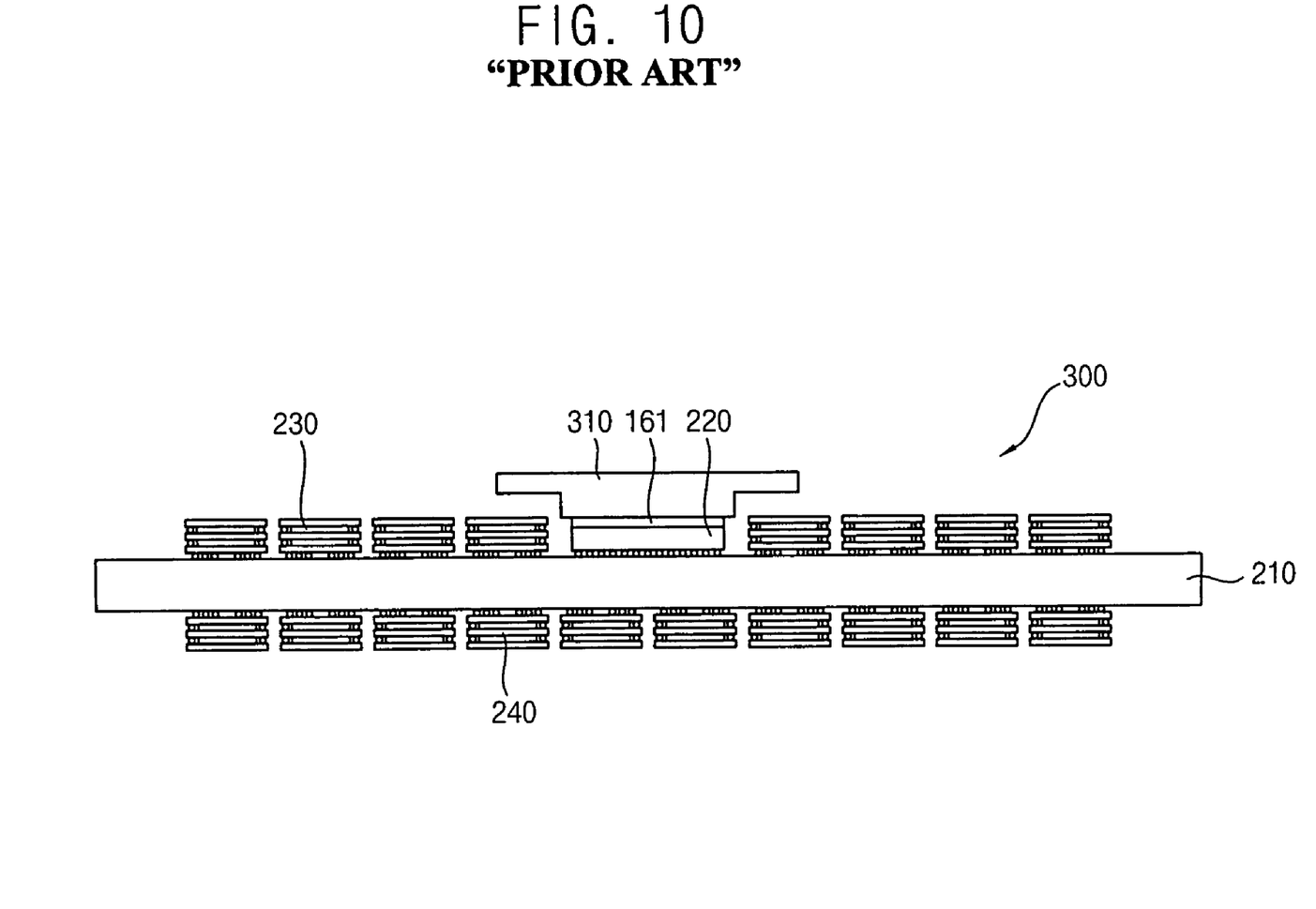
FIG. 10 shows a memory module with a conventional heat spreading device.
Figure 11:
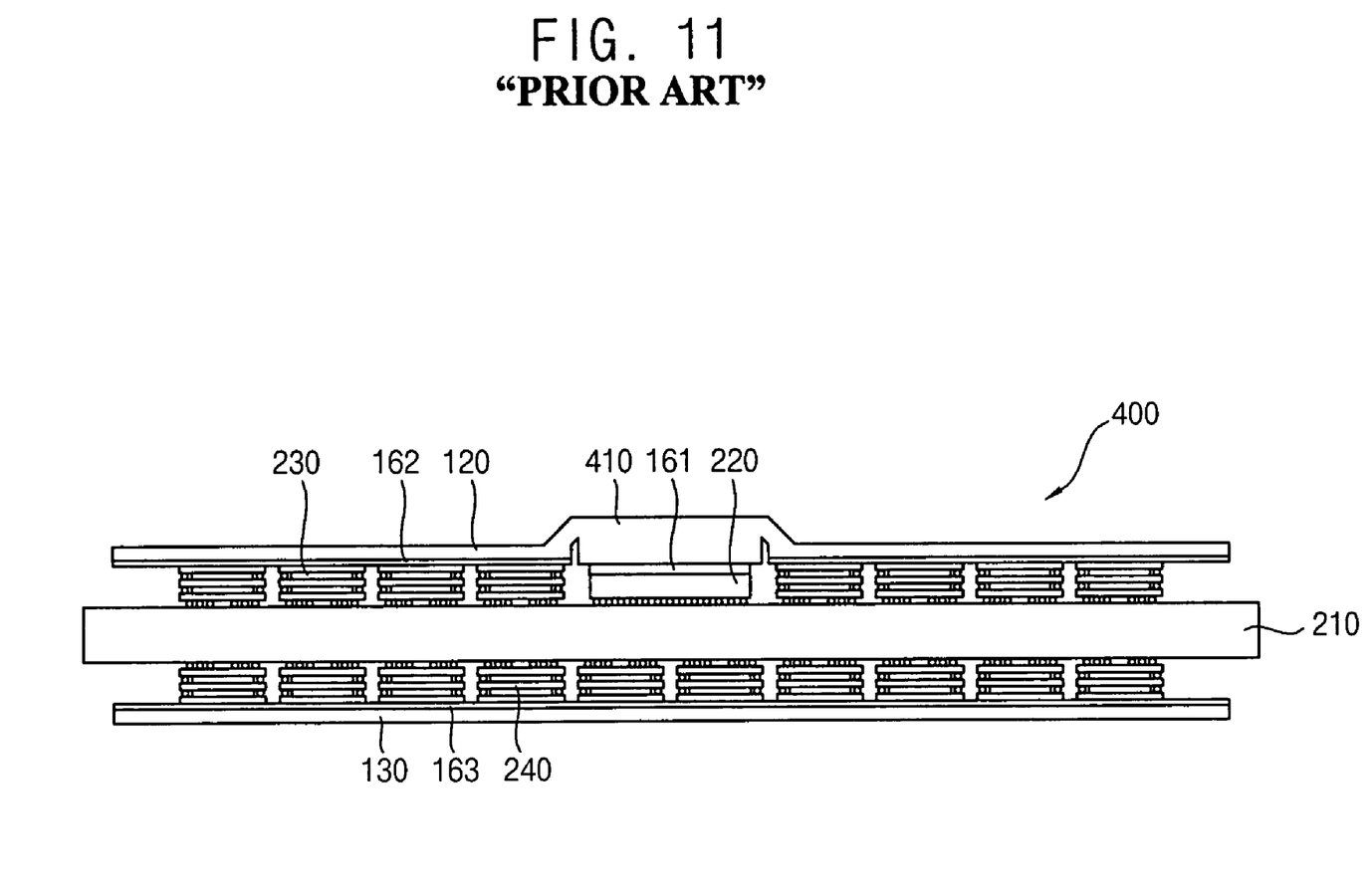
FIG. 11 shows a memory module with another conventional heat spreading device.

Conventionally, one or more heat sink or heat spreading device can be coupled to the AMB to spread the heat generated there-from. FIG. 10 shows a single heat spreader 310 coupled to the AMB 220. The heat spreader 310 dissipates heat from the AMB 220 but heat generated from the circuit chips 230 are not dissipated with any heat spreading medium other than the natural airflow. FIG. 11 shows a conventional monolithic heat spreading device 410 which is placed on the AMB 220 and on circuit chips 230 of the same line. In such configuration, with the AMB and the circuit chips operating at different temperatures, the heat spreader 410 may not dissipate heat effectively because the heat spreader 410 may act as a heat conduit to raise instead of lower the temperature at the circuit chips disposed adjacent to the AMB 220. Further, dissipation of heat at the hottest operating chip may be difficult when adjacent chips are also generating heat, aggregating instead of spreading heat generated from all the chips.

A need therefore exists for a monolithic cooling apparatus having a plurality of heat spreaders and having varying heat-dissipating characteristics to correspond to the different amount of heat generated from different chips on the package.

A need also exists for a cooling apparatus having multiple heat spreading portions, with a high heat spreading portion thermally coupled to an AMB and lesser heat spreading portions thermally coupled to memory modules of an FBDIMM.

SUMMARY OF THE INVENTION

A cooling apparatus is provided for a circuit module having a substrate extending axially with an IC chip of a first type and IC chips of a second type mounted thereon, comprising a first heat spreading element disposed to form a heat conduction path with the IC chip of the first type; and a second heat spreading element disposed to form a heat conduction path with the IC chips of the second type, wherein there is at least one IC chip of the second type mounted axially away from opposite sides of the IC chip of the first type, wherein the first type of IC chip is capable of generating a larger amount of heat than the second type of IC chips, and the first heat spreading element has a higher thermal conductivity than the second heat spreading element.

Preferably, the first and second heat spreading elements have portions that overlap each other but the overlapping portions form substantially no heat conduction path, wherein the first heat spreading element has a planar body which contacts the IC chip of the first type and the second heat spreading element has a planar body which contacts the IC chips of the second type to form respective heat conduction paths.

The first heat spreading element includes pins extending vertically from the planar body for contacting the second heat spreading element but spatially separating the planar body of the first heat spreading element from the planar body of the second heat spreading element, wherein the pins are made of thermally nonconductive material.

A thermal interface material is interposed between the planar body of the first heat spreading element and the IC chip, and between the planar body of the second heat spreading element and the IC chips.

According to an aspect of the present invention, the first and second heat spreading elements each has a planar body disposed in a separate but parallel plane from the other. The IC chip of the first type is an AMB and the IC chips of the second type are memory devices, wherein the circuit module is one of a SIMM, a DIMM, or an FBDIMM.

A third heat spreading element is disposed on a side of the substrate opposite to the side having the first heat spreading element, wherein the second or third heat spreading element has a planar body and at least two posts extend vertically from the planar body to provide a spatial separation from the other heat spreading element. A clip may be used to bind the heat spreading elements to the substrate.

Preferably, the first heat spreading element has an axial length of about 25 mm to about 50 mm and is made of copper or copper alloy and the second heat spreading element is made of aluminum or aluminum alloy, wherein the thickness of the first heat spreading element is about 1.0 mm to 2.0 mm and the second heat spreading element is about 0.4 to 1.0 mm, wherein each of the pins is about 0.2 mm in thickness. The first heat spreading element may include a plurality of fins, a thermoelectric cooler device, or a heat pipe device. The substrate is a PCB.

A cooling apparatus is also provided for a circuit module having a substrate extending axially with IC chips mounted thereon, comprising a first heat spreading element having a planar body disposed to form a heat conduction path with at least one IC chip of a first type; and a second heat spreading element having a planar body disposed to form a heat conduction path with IC chips of a second type, wherein the substrate, the planar body of the first heat spreading element, and the planar body of the second heat spreading element are disposed one above another and in spatially distant but parallel planes, wherein the first type of IC chip is capable of generating a larger amount of heat than the second type of IC chips, and the first heat spreading element has a higher thermal conductivity than the second heat spreading element.

The first and second heat spreading elements have portions that overlap each other but the overlapping portions form substantially no heat conduction path. The planar body of the first heat spreading element contacts the IC chip of the first type and the planar body of the second heat spreading element contacts the IC chips of the second type to form respective heat conduction paths, wherein the first heat spreading element includes pins extending vertically from the planar body for contacting the second heat spreading element but spatially separating the planar body of the first heat spreading element from the planar body of the second heat spreading element. The pins may be made of thermally nonconductive material.

A thermal interface material is interposed between the planar body of the first heat spreading element and the first IC chip and between the planar body of the second heat spreading element and the second IC chips, wherein the IC chip of the first type may be an AMB and the IC chips of the second type may be memory devices. The circuit module is one of a SIMM, a DIMM, or a FBDIMM.

A third heat spreading element may be disposed on a side of the substrate opposite to the side having the first heat spreading element.

According to another aspect of the present invention, a cooling apparatus is provided for an in-line memory module having an AMB chip and a plurality of memory chips, comprising a first heat spreading element disposed to form a heat conduction path with the AMB chip, and a second heat spreading element disposed to form a heat conduction path with the plurality of memory chips, wherein the first heat spreading element and the second heat spreading element are disposed above the memory module and the first heat spreading element has a higher thermal conductivity than the second heat spreading element.

BRIEF DESCRIPTION OF THE DRAWINGS

The features of the present invention will become more apparent to those of ordinary skill in the art by Describing in detail preferred embodiments thereof with reference to the attached drawings in which like numbers refer to like elements.

DETAILED DESCRIPTION OF EXEMPLARY EMBODIMENTS OF INVENTION

Figure 1:
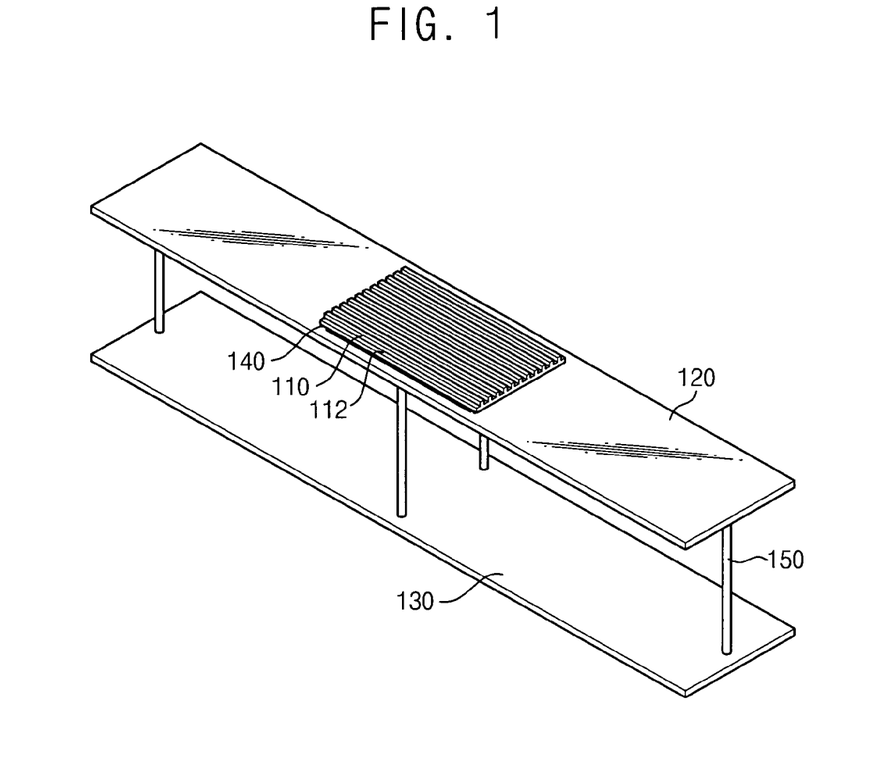
FIG. 1 is a perspective view of a cooling apparatus in accordance with an exemplary embodiment of the present invention.
Figure 2:
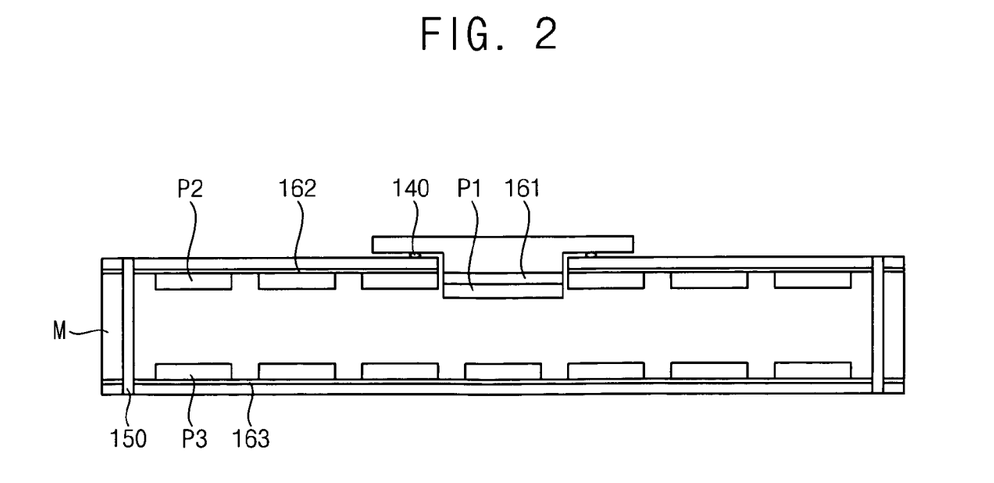
FIG. 2 is a cross sectional view of a cooling apparatus shown in FIG. 1.

FIG. 1 is a perspective view and FIG. 2 is a cross sectional view of a cooling apparatus in accordance with an exemplary embodiment of the present invention. The cooling apparatus comprises first heat conductor 110, second heat conductor 120, third heat conductor 130, and post 150.

The first heat spreader 110 has a planar plate-like portion and a body portion for receiving a circuit chip such as an AMB. The first heat spreader 110 is preferably made with a material having high thermal conductivity, such as copper or copper alloy. The first heat spreader 110 further preferably includes a plurality of fins 112 on the plate portion to increase the surface area and thus improve the capability of heat-dissipation.

The second heat spreader 120 is also planar shaped and has a cut-out portion at or around the mid-portion to accommodate the body portion of the first heat spreader 110 (See FIG. 2). The second heat spreader 120 is preferably made with a material having a lesser thermal conductivity than that of the first heat spreader 110. Material such as aluminum or aluminum alloy is preferred. The second heat spreader 120 is linked to the first heat spreader 110 by pins 140. The pins 140 are preferably made with thermally non-conductive material. Thus, the planar portion of the first heat spreader 110 and the planar second heat spreader 120 have portions which overlap each other but the overlapping portions form substantially no heat conduction path.

The third heat spreader 130 is also preferably planar and made with the same material as the second heat spreader 120. The third heat spreader 130 has no cut-out portion and is coupled to the second heat spreader via posts 150. The posts 150 can be made of metallic rivet or bolt.

As shown in FIG. 2, the first heat spreader 110 is coupled thermally to P1, which denotes a high heat generating circuit chip. The second heat spreader 120 is coupled to P2, which denotes lesser heat generating circuit chip(s). The third heat spreader 130 is coupled to P3, which denotes similar heat generating circuit chips as P2. According to an exemplary embodiment of the present invention, P1 is the AMB, P2 is a memory chip of an FBDIMM, and P3 is a memory chip of a second line of chips. In such embodiment, the heat generation of P1, P2, and P3 is P1>(P2=P3), with the heat generation of P1 being as much as about ten times (10×) that of P2 or P3. According to an exemplary embodiment of the present invention as shown in FIG. 2, the first heat spreader 110 is essentially suspended from the second heat spreader 120, except they are linked via pins 140. If pins 140 are made with thermally conductive material, the pins 140 are circular so that the contact areas of pins 140 to either the first heat spreader 110 or the second heat spreader 120 are small to minimize heat conduction between the first heat spreader 110 and the second heat spreader 120. Preferably, the pins 140 have a cross-sectional area of contact with the planar body that is less than 30 mm$^2$. Alternatively, the pins 140 are made with thermally non-conductive material, such as resin. According to an exemplary embodiment of the present invention, the first heat spreader 110 has a thickness of about 1.0 mm to about 2.0 mm, an axial length of about 25 mm to about 50 mm, and heat conductivity of about 385 watts per meter Kelvin (W/mk). The second heat spreader 120 or the third heat spreader 130 has a thickness of about 0.4 mm to about 1.0 mm and heat conductivity of about 180 W/mk. The pins 140 are about 0.2 mm in thickness.

A thermal interface material (TIM) 161, 162, 163 is disposed between the chips P1, P2, or P3 and the first, second and third heat spreaders, respectively, to transfer heat generated from the chips to the heat spreaders. The TIM is a compound of resin and thermally conductive material such as aluminum, silica, etc. The TIM enhances contact and promotes heat transfer between the chips and the heat spreaders.

Figure 3:
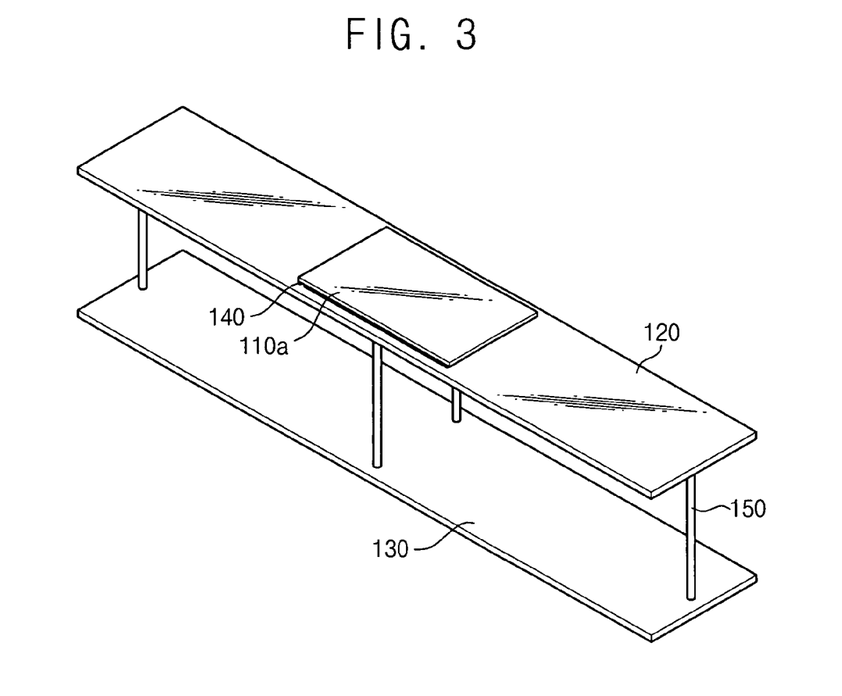
FIG. 3 shows an exemplary embodiment of the present invention employing an active cooling device.

FIG. 3 shows another exemplary embodiment of the present invention employing an active cooling device. Referring to FIG. 3, the first heat spreader 110*a* is a thermal-electric cooler (Peltier) device. The Peltier device 110*a* is made of first/second heat generation plate 111*a*/112*a*, heat absorption plate 115*a*, N/P-type semiconductor device 113*a*/114*a* and power 116*a*.

Figure 4:
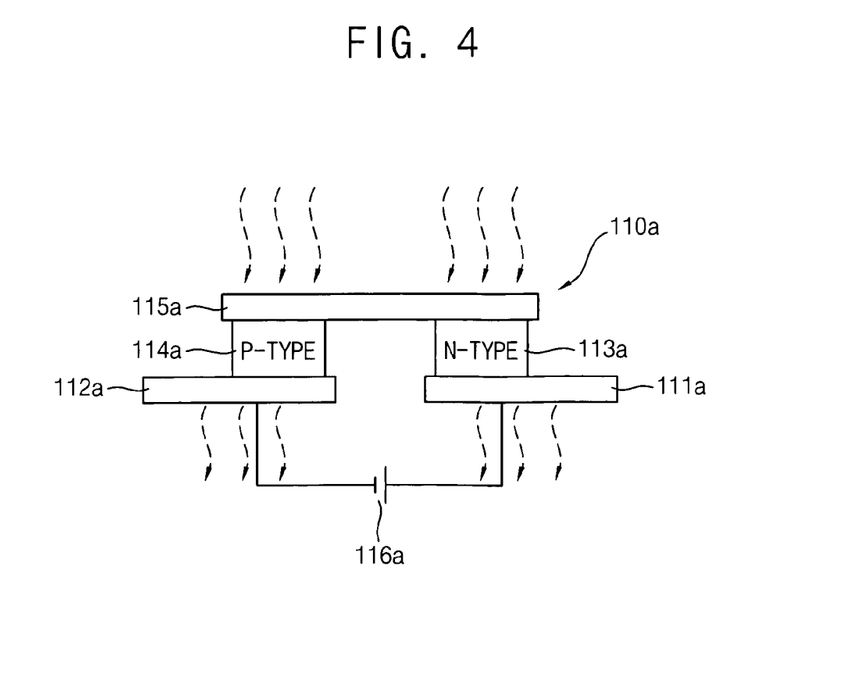
FIG. 4 shows a cross sectional view of the active cooling device of FIG. 3.

Referring to FIG. 4, a sectional view of the device of FIG. 3, the power 116*a* provides an electric current to the first heat generation plate 111*a*. The electric current flows to the second heat generation plate 112*a* through N-type semiconductor device 113*a*, heat absorption plate 115*a* and P-type semiconductor device 114*a*. The heat absorption plate 115*a* is attached to P1 type chip(s) for dissipating the heat generated there-from.

Figure 5:
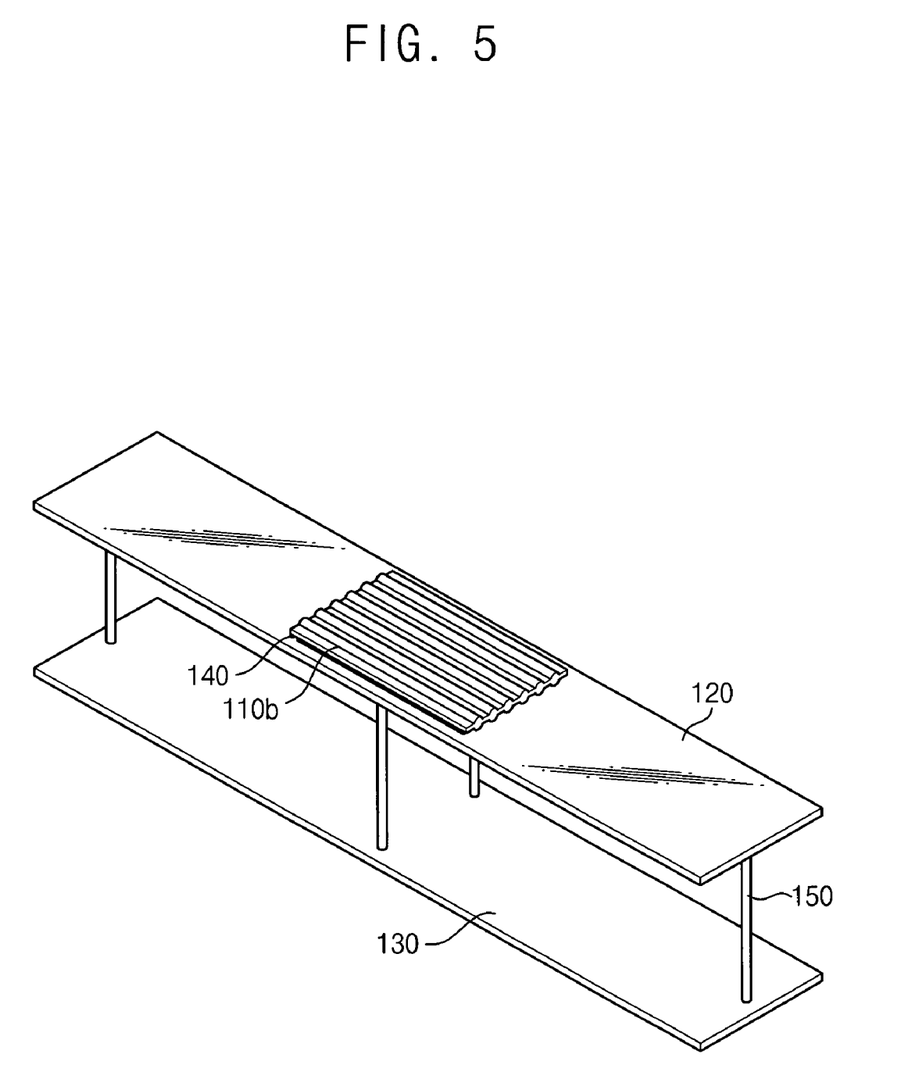
FIG. 5 shows an embodiment of the present invention employing a heat radiator.

FIG. 5 shows another embodiment of the present invention. Referring to FIG. 5, the first heat spreader 110*b* is a heat radiator, made with pipes having heat transferring liquid. The first heat spreader 110*b* is thermally coupled to P1 to dissipate heat generated by P1. For example, a volatile solvent can be used in the heat pipe 110*b*. In such embodiment, as the temperature in the part of the heat pipe rises, the volatile solvent vaporizes and moves to the other part of the heat pipe. During the transfer of the volatile solvent, the chip P1 is cooled by interchanging heat between P1 and the volatile solvent and the volatile solvent is vaporized.

Figure 6:
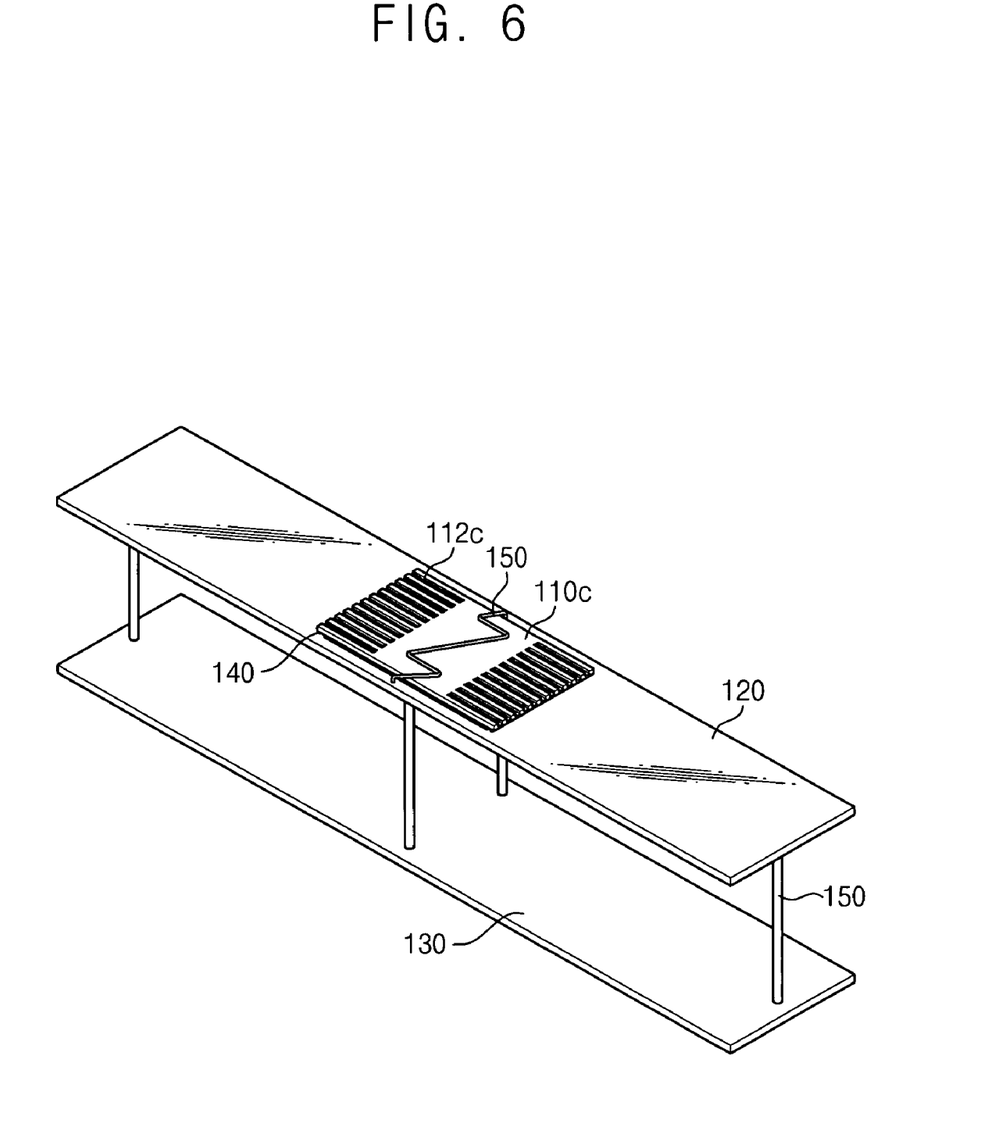
FIG. 6 shows an embodiment according to the present invention employing a heat spreader with fins.

FIG. 6 shows another embodiment according to the present invention. Referring to FIG. 6, the first heat spreader 110*c* is a thin plate having two side portions and a center portion. The side portions include a plurality of grooves or fins 112*c* to increase the heat spreading surface area. The center portion is configured and dimensioned substantially the same in thickness and size of P1 so that P1 fits snuggly therein. A clip-type spring 150 can be used to further secure P1 to the first heat spreader 110*c* to further enhance thermal conduction.

Figure 7:
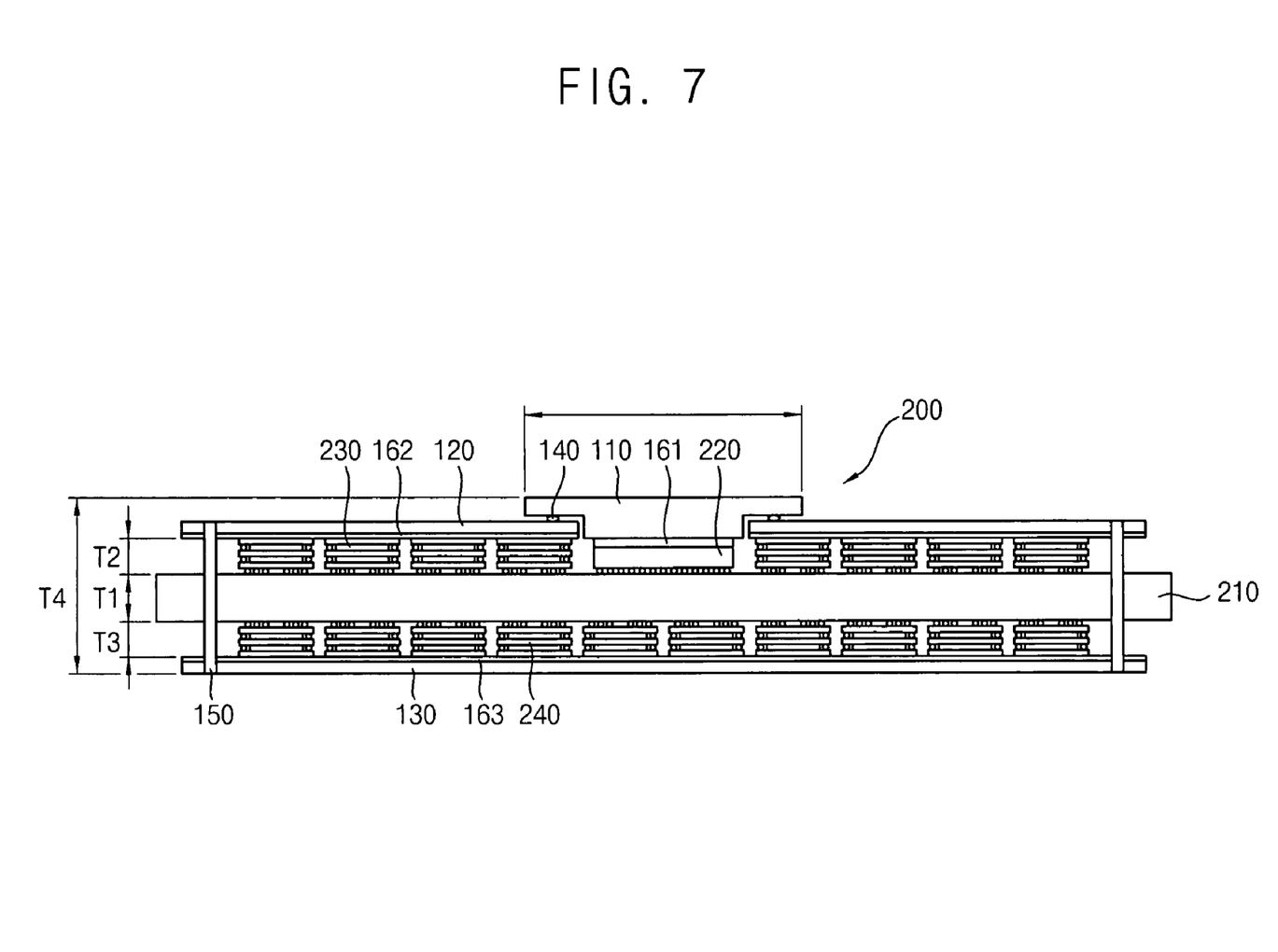
FIG. 7 is a cross-sectional view of a cooling apparatus for a memory module according to an exemplary embodiment of the present invention.

FIG. 7 is a cross-sectional view of a memory module 200 according to an exemplary embodiment of the present invention. The memory module 200 is made of a Printed Circuit Board (PCB) 210 having mounted thereon an AMB 220, first semiconductor circuit or memory packages 230, second semiconductor circuit or memory packages 240 and cooling apparatus having first, second, and third spreaders 110, 120, and 130, respectively. The AMB 220 corresponds to the P1 mentioned in the exemplary embodiment as shown in FIG. 2.

Figure 8:
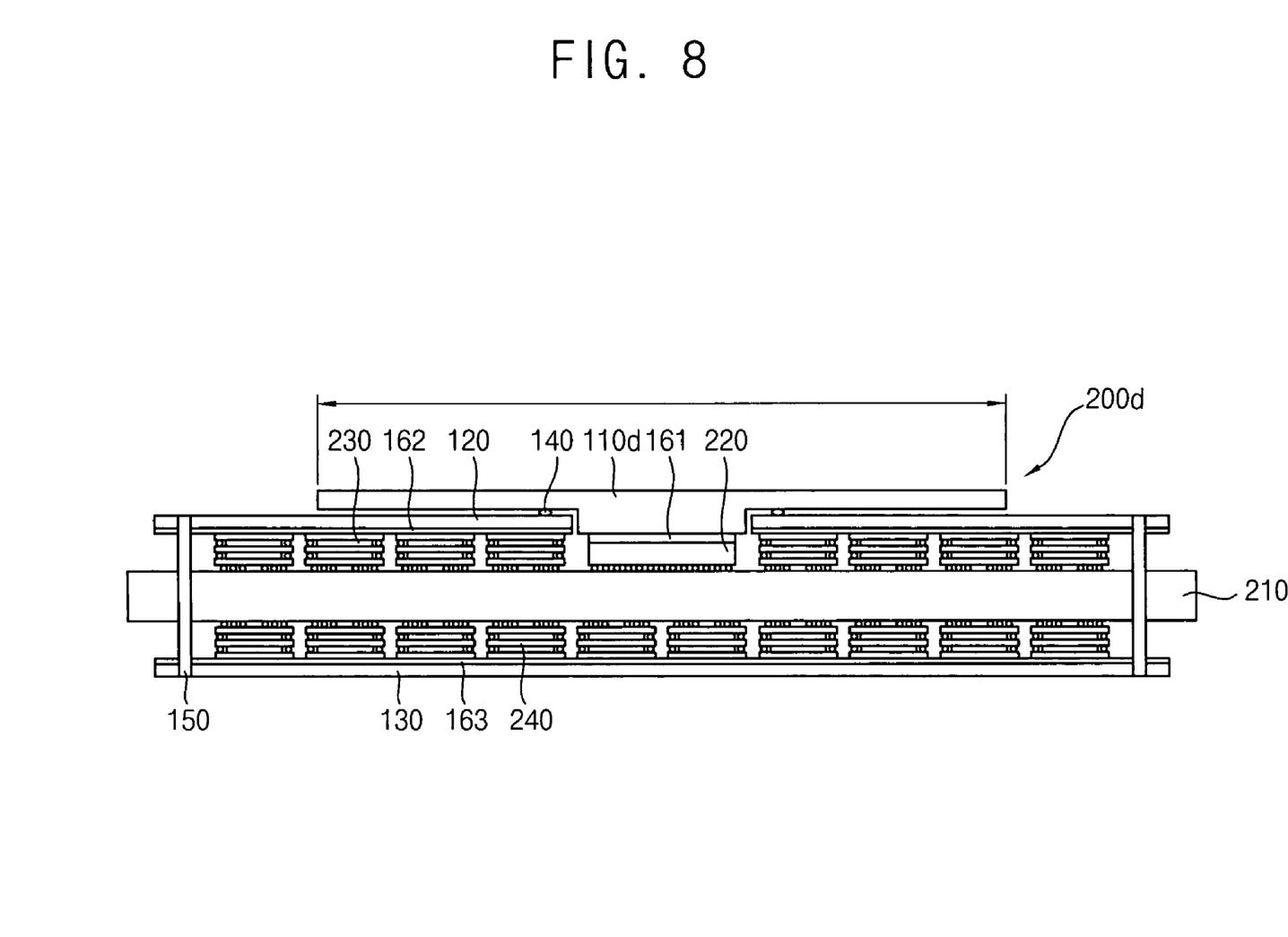
FIG. 8 is a cross-sectional view of a cooling apparatus for a memory module according to another exemplary embodiment of the present invention.

FIG. 8 shows another exemplary embodiment according to the present invention. In the present embodiment, first heat spreader 110*d* includes a planar portion which extends axially to overlap slightly more than half the length of the second heat spreader 120. As in the embodiment of FIG. 7, the planar portion of the first heat spreader 110*d* suspends from the second heat spreader 120 and the planar portions of the first and the second heat spreaders are substantially parallel to each other.

Figure 9:
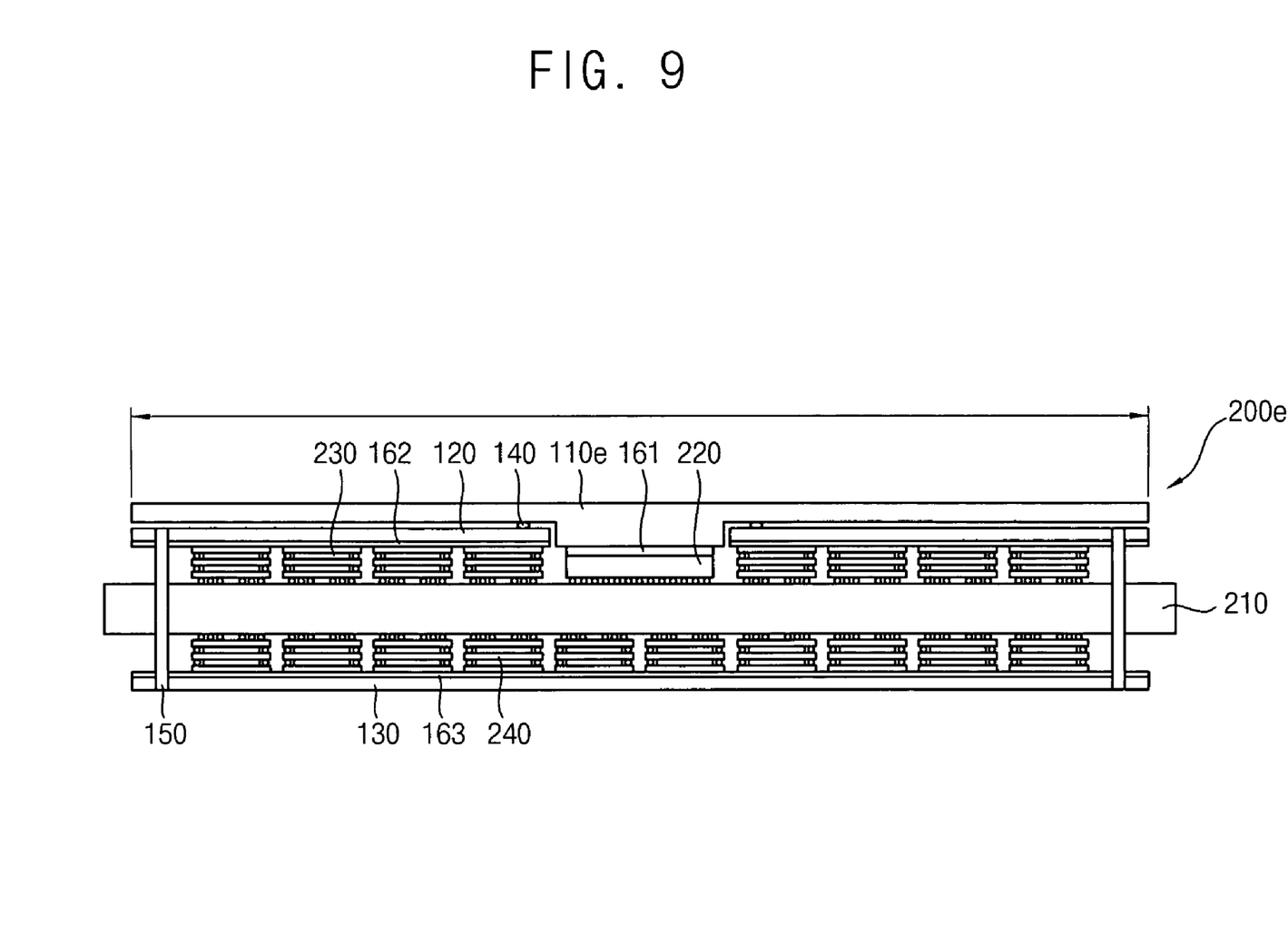
FIG. 9 is a cross-sectional view of a cooling apparatus memory module according to still another exemplary embodiment of the present invention.

FIG. 9 shows still another exemplary embodiment of the present invention. In the present embodiment, the planar portion of the first heat spreader 110*e* extends axially to about the same axial length of the second heat spreader 120.

Table 1 is a tabulation of measured junction temperature at the AMB (P1) in the various configurations shown in FIGS. 7 to 11.

It can be seen from Table 1 that the conventional configurations of heat spreading shown in FIG. 10 and FIG. 11 result in the highest junction temperatures at the AMB, with the configuration of FIG. 11 having the highest junction temperature. As previously described, the monolithic heat spreading device contacting both P1 and P2 type circuits tend to aggregate rather than dissipate heat from the AMB and the memory packages.

TABLE 1

| Velocity | Max. Junction Temp (° C.) of AMB | |
|---|---|---|
| | 3 m/s | 4 m/s |
| FIG. 10 | 99.0 | 90.3 |
| FIG. 11 | 100.4 | 91.9 |
| FIG. 7 | 91.3 | 82.7 |
| FIG. 8 | 96.1 | 88.9 |
| FIG. 9 | 97.6 | 88.9 |

Table 1 also shows that each of the three embodiments shown in FIGS. 7, 8, and 9, the AMB operates at a lower junction temperature than the conventional configurations shown in FIGS. 10 and 11. Further, according to the measurements of Table 1, the configuration of the first and second heat spreaders shown in exemplary embodiment of FIG. 7 performs the most effectual heat spreading as compared to those of FIGS. 8 and 9.

The invention has been described with reference to preferred exemplary embodiments. However, it is to be understood that the scope of the invention is not limited to the disclosed embodiments. The scope of the invention is intended to include various modifications and alternative arrangements within the capabilities of persons skilled in the art using presently known or future technologies and equivalents. The scope of the claims, therefore, should be accorded the broadest interpretation so as to encompass all such modifications and similar arrangements.

What is claimed:

1. A cooling apparatus for a circuit module having a substrate extending axially with an IC chip of a first type and IC chips of a second type mounted thereon, comprising:
a first heat spreading element disposed to form a heat conduction path with the IC chip of the first type; and
a second heat spreading element disposed to form a heat conduction path with the IC chips of the second type,
wherein at least one IC chip of the second type is mounted adjacent to the IC chip of the first type, and the first heat spreading element has a higher thermal conductivity than the second heat spreading element, and
wherein the first and second heat spreading elements have portions that overlap each other but the overlapping portions form substantially no heat conduction path.

2. The apparatus of claim 1, wherein the first heat spreading element has a planar body which contacts the IC chip of the first type and the second heat spreading element has a planar body which contacts the IC chips of the second type to form respective heat conduction paths.

3. The apparatus of claim 2, wherein the first heat spreading element includes pins extending vertically from the planar body for contacting the second heat spreading element but spatially separating the planar body of the first heat spreading element from the planar body of the second heat spreading element.

4. The apparatus of claim 3, wherein the pins are made of thermally conductive material and the pins have a cross-sectional area of contact with the planar body that is less than 30 mm².

5. The apparatus of claim 3, wherein the pins are made of thermally nonconductive material.

6. The apparatus of claim 3, wherein each of the pins is about 0.2 mm in thickness.

7. The apparatus of claim 2, further including a thermal interface material interposed between the planar body of the first heat spreading element and the IC chip.

8. The apparatus of claim 2, further including a thermal interface material interposed between the planar body of the second heat spreading element and the IC chips.

9. The apparatus of claim 1, wherein the first and second heat spreading elements each has a planar body disposed in a separate but parallel plane from the other.

10. The apparatus of claim 9, wherein the circuit module is a SIMM.

11. The apparatus of claim 1, wherein the IC chip of the first type is an AMB and the IC chips of the second type are memory devices.

12. The apparatus of claim 1, further including a third heat spreading element disposed on a side of the substrate opposite to the side having the first heat spreading element.

13. The apparatus of claim 12, wherein the second or third heat spreading element has a planar body and at least two posts extending vertically from the planar body to provide a spatial separation from the other heat spreading element.

14. The apparatus of claim 12, further including a clip to bind the heat spreading elements to the substrate.

15. The apparatus of claim 12, wherein the circuit module is a DIMM.

16. The apparatus of claim 1, wherein the first conducting element is made of copper or copper alloy and the second heat spreading element is made of aluminum or aluminum alloy.

17. The apparatus of claim 1, wherein the thickness of the first heat spreading element is about 1.0 mm to 2.0 mm and the second heat spreading element is about 0.4 to 1.0 mm.

18. The apparatus of claim 1, wherein the first heat spreading element includes a plurality of fins.

19. The apparatus of claim 1, wherein the first heat spreading element includes a thermo-electric cooler device.

20. The apparatus of claim 1, wherein the first heat spreading element includes a heat pipe device.

21. The apparatus of claim 1, wherein the substrate is a PCB.

22. The apparatus of claim 1, wherein the first heat spreading element has an axial length of about 25 mm to about 50 mm.

23. A cooling apparatus for a circuit module having a substrate extending axially with IC chips mounted thereon, comprising:
   a first heat spreading element having a planar body disposed to form a heat conduction path with at least one IC chip of a first type; and
   a second heat spreading element having a planar body disposed to form a heat conduction path with IC chips of a second type,
   wherein the substrate, the planar body of the first heat spreading element, and the planar body of the second heat spreading element are disposed one above another and in spatially distant but parallel planes.

24. The apparatus of claim 23, wherein the first type of IC chip is capable of generating a larger amount of heat than the second type of IC chips, and the first heat spreading element has a higher thermal conductivity than the second heat spreading element.

25. The apparatus of claim 23, wherein the first and second heat spreading elements have portions that overlap each other but the overlapping portions form substantially no heat conduction path.

26. The apparatus of claim 23, wherein the planar body of the first heat spreading element contacts the IC chip of the first type and the planar body of the second heat spreading element contacts the IC chips of the second type to form respective heat conduction paths.

27. The apparatus of claim 26, further including a thermal interface material interposed between the planar body of the first heat spreading element and the IC chip of the first type.

28. The apparatus of claim 26, further including a thermal interface material interposed between the planar body of the second heat spreading element and the IC chips of the second type.

29. The apparatus of claim 23, wherein the first heat spreading element includes pins extending vertically from the planar body for contacting the second heat spreading element but spatially separating the planar body of the first heat spreading element from the planar body of the second heat spreading element.

30. The apparatus of claim 29, wherein the pins are made of thermally nonconductive material.

31. The apparatus of claim 23, wherein the IC chip of the first type is an AMB and the IC chips of the second type are memory devices.

32. The apparatus of claim 23, wherein the circuit module is a SIMM.

33. The apparatus of claim 23, further including a third heat spreading element disposed on a side of the substrate opposite to the side having the first heat spreading element.

34. The apparatus of claim 33, wherein the circuit module is a DIMM.

35. The apparatus of claim 23, wherein the first conducting element is made of copper or copper alloy and the second heat spreading element is made of aluminum or aluminum alloy.

36. The apparatus of claim 23, wherein the thickness of the first heat spreading element is about 1.0 mm to 2.0 mm and the second heat spreading element is about 0.4 to 1.0 mm.

37. The apparatus of claim 23, wherein the first heat spreading element includes a plurality of fins.

38. The apparatus of claim 23, wherein the first heat spreading element includes one of a thermo-electric cooler device or a heat pipe device.

39. The apparatus of claim 1, wherein the substrate is a PCB.

40. The apparatus of claim 1, wherein the first heat spreading element has an axial length of about 25 mm to about 50 mm.

41. A cooling apparatus for an in-line memory module having an AMB chip and a plurality of memory chips, comprising:
   a first heat spreading element disposed to form a heat conduction path with the AMB chip; and
   a second heat spreading element disposed to form a heat conduction path with the plurality of memory chips,
   wherein the first heat spreading element and the second heat spreading element are disposed above the memory module and the first heat spreading element has a higher thermal conductivity than the second heat spreading element, and wherein the first and second heat spreading elements have portions that overlap each other but the overlapping portions form substantially no heat conduction path.

42. The cooling apparatus of claim 41, wherein the memory module is one of a SIMM or a DIMM.

* * * * *